US007238960B2

(12) United States Patent
Sundaram et al.

(10) Patent No.: US 7,238,960 B2
(45) Date of Patent: *Jul. 3, 2007

(54) QWIP WITH ENHANCED OPTICAL COUPLING

(75) Inventors: Mani Sundaram, Nashua, NH (US); Axel R Reisinger, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 202 days.

This patent is subject to a terminal disclaimer.

(21) Appl. No.: 10/781,523

(22) Filed: Feb. 18, 2004

(65) Prior Publication Data

US 2004/0159775 A1   Aug. 19, 2004

Related U.S. Application Data

(63) Continuation-in-part of application No. 09/746,956, filed on Dec. 22, 2000, now Pat. No. 6,875,975.

(60) Provisional application No. 60/173,077, filed on Dec. 24, 1999.

(51) Int. Cl.
*H01L 31/042* (2006.01)
*H01L 31/0352* (2006.01)

(52) U.S. Cl. .................. 257/21; 250/214.1; 257/432

(58) Field of Classification Search ............... 257/21, 257/432
See application file for complete search history.

(56) References Cited

U.S. PATENT DOCUMENTS 5,485,015 A * 1/1996 Choi ......................... 257/21

| 6,211,529 | B1 | 4/2001 | Gunapala et al. |
| 6,452,187 | B1 * | 9/2002 | Claiborne et al. ...... 250/370.12 |
| 6,469,358 | B1 * | 10/2002 | Martin ..................... 257/440 |
| 2002/0008191 | A1 * | 1/2002 | Faska et al. ............. 250/208.1 |
| 2002/0167984 | A1 * | 11/2002 | Scherer .................... 372/50 |
| 2004/0108564 | A1 * | 6/2004 | Mitra ....................... 257/442 |

OTHER PUBLICATIONS

Temelkuran et al "Photonic . . . detectros" IQEC '98 pp. 80-81, May 3-8, 1998.*
Krauss et al "Fabrication . . . " Electr. Lett. vol. 30 No. 17 pp. 1444-1446 Aug. 18, 1994.*

(Continued)

*Primary Examiner*—Jerome Jackson
(74) *Attorney, Agent, or Firm*—Maine & Asmus (57) ABSTRACT

A QWIP structure is disclosed that is configured with enhanced optical coupling to improve absorption capability and efficiency. A waffle-type light-coupling grating having a pattern of etched wells operates to improve absorption by preventing photons from bouncing out of the detector sensing areas. A post-type light coupling grating can also be used. Parameters of the grating, including its orientation, pitch, and etch depth, can be adjusted to optimize specific color detection. The grating can include a hybrid metal layer including both ohmic and reflective qualities to further improve quantum and conversion efficiency. A "photon-in-a-box" configuration is also disclosed, where sides of the QWIP sensing areas are coated with reflective metal to further inhibit the escaping of photons. The material design and number of quantum wells per QWIP can be selected so as to exploit the avalanche effect, thereby increasing device responsivity.

8 Claims, 11 Drawing Sheets

OTHER PUBLICATIONS

Tsai et al, IEEE Electron Device Letters, vol. 16 No. 2, Feb. 1995 "Two-Dimensional . . . Photodetectors" pp. 49-51.*

"Tridirectional Gratings as Improved Couplers for QWIPs", NASA Tech Briefs, May 2000, pp. 1-3, NPO-20703, NASA's Jet Propulsion Laboratory, Pasadena.

"Metal Side Reflectors for Trapping Light in QWIPs", NASA Tech Briefs, Jun. 2003, pp. 1-2, NPO-30507, NASA's Jet Propulsion Laboratory, Pasadena, CA.

"qwip:Frequently Asked Questions", qwip.jpl.nasa.gov, 2000, pp. 1-2, NASA Jet Propulsion Laboratory, Pasadena, CA.

"qwip:Frequently Asked Questions", qwip.jpl.nasa.gov, 2000, pp. 1-3, NASA Jet Propulsion Laboratory, Pasadena, CA.

Gunapala, S. D. et al., "640x512 Pixel Four-Band, Broad-Band, and Narrow-Band Quantum Well Infrared Photodetector Focal Plane Arrays", pp. 1-12.

Gunapala, S. D. et al., "640x486 Long-wavelength Two-color GaAs/AlGaAs Quantum Well Infrared Photodector (QWIP) Focal Plane Array Camera", pp. 1-24.

Gunapala, S. D. et al., "Quantum Well Infrared Photodector (QWIP) Focal Plane Arrays", Semiconductors and Semimetals, 1999, pp. 1-83, vol. 62.

PCT International Search Report dated Jan. 31, 2006 of International Application No. PCT/US05/03321 filed Feb. 3, 2005.

Bandara et al, "Tridirectional Gratings as Improved Couplers for QWIPs", vol. NPO-20703, NASA Tech. Briefs issue, May 2000, pp. 1-3.

Gunapala et al, "Metal Side Reflectors for Trapping Light in QWIPs", vol. NPO-30507, NASA Tech Briefs Issue, Jun. 2003, pp. 1-2.

Temelkuran et al, "Photonic-crystal-based resonant-cavity-enhanced detectors", IQEC'98, May 3, 1998, pp. 80-81.

Krauss et al, "Fabrication of 2-D photonic bandgap structures in GaAs/AlGaAs", Electronics Letters, vol. 30, No. 17, Aug. 18, 1994, pp. 1444-1445.

* cited by examiner

FIG. 7c
0° Orientation

FIG. 7f
45° Orientation

FIG. 7b
45° Orientation

FIG. 7e
0° Orientation

FIG. 7a
0° Orientation

FIG. 7d
45° Orientation

QWIP WITH ENHANCED OPTICAL COUPLING

RELATED APPLICATIONS

This application is a continuation-in-part of U.S. patent application Ser. No. 09/746,956, filed Dec. 22, 2000 now U.S. Pat. No. 6,875,975, which claims the benefit of U.S. Provisional Application No. 60/173,077, filed Dec. 24, 1999. Each of these applications is herein incorporated in its entirety by reference.

FIELD OF THE INVENTION

The invention relates to quantum well infrared photodetector (QWIP) technology, and more particularly, to a QWIP configured with enhanced optical coupling to improve detector quantum efficiency.

BACKGROUND OF THE INVENTION

A quantum well designed to detect infrared (IR) light is called a quantum well infrared photodetector (QWIP). QWIPs operate by photo-excitation of electrons between a ground state and an excited state of its quantum wells. In more detail, a quantum well absorbs IR photons. This absorption of IR photons photo-excite electrons from the ground state to the excited state of each quantum well. The excited states of the quantum wells making up a QWIP effectively form an energy transport band (sometimes referred to as the continuum or a miniband). A voltage externally applied to the QWIP operates to sweep out the photo-excited electrons, thereby producing a photocurrent in the continuum.

Quantum wells are grown in a crystal structure. In general, layers of two different, high-bandgap semiconductor materials are alternately grown. The bandgap discontinuity of the two semiconducting materials creates quantized subbands in the wells associated with conduction bands. Only photons having energies corresponding to the energy separation between the ground and excited states are absorbed. This is why a QWIP has such a sharply defined absorption spectrum. Note that each well can be shaped to detect a particular wavelength, and so that it holds the ground state near the well bottom, and the excited state near the well top.

A group of QWIPs can be used to form a focal plane array (FPA) in detection applications, where each QWIP effectively acts as a pixel of the array. The quantum-well layers of a QWIP FPA are usually oriented parallel to the focal plane and therefore perpendicular to the direction of incidence of IR. Based on applicable quantum mechanic selection rules, light polarized parallel to the focal plane cannot photo-excite electrons from the ground state to the excited state of a quantum well. Such light will therefore not be detected by the QWIP.

Thus, with conventional QWIP configurations, absorption quantum efficiency achieved is relatively limited. Net quantum efficiency can be determined by multiplying the absorption quantum efficiency by the photoconductive gain, where the photoconductive gain of a QWIP depends on various design choices made. In addition, light traveling substantially parallel to the focal plane can escape sideways from the QWIP of a given pixel. This escaped light is effectively left out of the detection process, in that its pass through the photosensitive volume of the QWIP is limited. This loss of IR further contributes to low quantum efficiency.

What is needed, therefore, is a QWIP design that provides greater quantum efficiency.

BRIEF SUMMARY OF THE INVENTION

One embodiment of the present invention provides a pixel-registered photo detector array. The array includes one or more detector layers of semiconductor material. Each detector layer is between contact layers of semiconductor material, thereby defining a stack of layers of a multicolor photo detector having a front side and a back side. A rotated light-coupling grating is formed on the backside of the stack, and has a pattern that reflects a substantial portion of light coming into the array, so as to disperse that light through the one or more detector layers, thereby facilitating absorption. In one such embodiment, the rotated light-coupling grating has an orientation of about 45 degrees, and has one of a waffle-type or post-type pattern. In another such embodiment, the light-coupling grating includes a hybrid metal layer having both ohmic and reflective qualities, and edges of each detector layer are reflectively coated so as to provide, in conjunction with the light-coupling grating, a photon-in-a-box configuration for containing light within each pixel of the array. The array can be configured as a strained-InGaAs/AlGaAs QWIP structure having a limited number of quantum wells so as to enable exploitation of avalanche effects.

Another embodiment of the present invention provides a pixel-registered photo detector array. The array includes one or more detector layers of semiconductor material. Each detector layer is between contact layers of semiconductor material, thereby defining a stack of layers having a front side and a back side. A waffle-type light-coupling grating is formed on the backside of the stack, and has a pattern of wells that reflects a substantial portion of light coming into the array so as to disperse that light through the one or more detector layers, thereby facilitating absorption. The pattern of the waffle-type light-coupling grating can be configured with a geometry optimized for a center wavelength of interest, and an orientation ranging from about 20 to 70 degrees. In one such embodiment, the geometry includes a well depth of about one quarter wavelength of the center wavelength of interest, and a spacing between the wells of about the center wavelength of interest.

The array may have a plurality of detector layers, with each having a different light absorption versus wavelength response curve thereby enabling a multicolor photo detector. The edges of the one or more detector layers can be reflectively coated so as to provide, in conjunction with the waffle-type light-coupling grating, a photon-in-a-box configuration for containing light within each pixel of the array. The waffle-type light-coupling grating may include, for example, a hybrid metal layer having both ohmic and reflective qualities to further improve reflectivity and absorption of the detector. In another such embodiment, each of the one or more detector layers is about one micron or less in thickness. Each of the contact layers can be electrically coupled to a respective electrical contact on the backside, thereby facilitating hybridization, where the array is mechanically and electrically connected to a substrate configured with supporting electrical circuitry.

Another embodiment of the present invention provides a pixel-registered photo detector array. The array includes one or more detector layers of semiconductor material. Each detector layer is between contact layers of semiconductor material, thereby defining a stack of layers having a front side and a back side. A light-coupling grating is formed on the backside of the stack with a hybrid metal layer having both ohmic and reflective qualities, and having a pattern that reflects a substantial portion of light coming into the array so as to disperse that light through the one or more detector layers, thereby facilitating absorption. The edges of the one or more detector layers are reflectively coated so as to provide, in conjunction with the light-coupling grating, a photon-in-a-box configuration for containing light within each pixel of the array.

The pattern of the light-coupling grating can be a waffle-type grating and have a geometry that includes a well depth of about one quarter wavelength of a center wavelength of interest, and a spacing between the wells of about the center wavelength of interest. The pattern of the light-coupling grating may have an orientation, for example, of about 45 degrees. Other orientations, however, can be used here as well, such a 0 degrees or 70 degrees. The array can be configured with a plurality of detector layers, each having a different light absorption versus wavelength response curve thereby enabling a multicolor photo detector. Each of the one or more detector layers can be, for example, about one micron or less in thickness. As previously indicated, each of the contact layers can be electrically coupled to a respective electrical contact on the backside, thereby facilitating hybridization where the array is connected to a substrate configured with supporting electrical circuitry.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide various structural features of a QWIP that enhance its optical coupling to improve absorption capability and efficiency. A waffle-type light-coupling grating having a pattern of etched wells operates to improve absorption by preventing photons from bouncing out of the detector sensing areas. Parameters of the grating, including its orientation, pitch, and depth, can be adjusted to optimize specific color detection.

In addition, a hybrid metal layer including both ohmic and reflective qualities can be provided at the top of the sensing area to further improve quantum efficiency as well as conversion efficiency. A "photon-in-a-box" configuration is also provided, where sides of the QWIP sensing area are coated with reflective metal to further prevent the escaping of photons, thereby further increasing absorption. The material design and number of quantum wells per QWIP can be selected so as to exploit the avalanche effect, thereby increasing device responsivity.

General QWIP Structure

Figure 1:
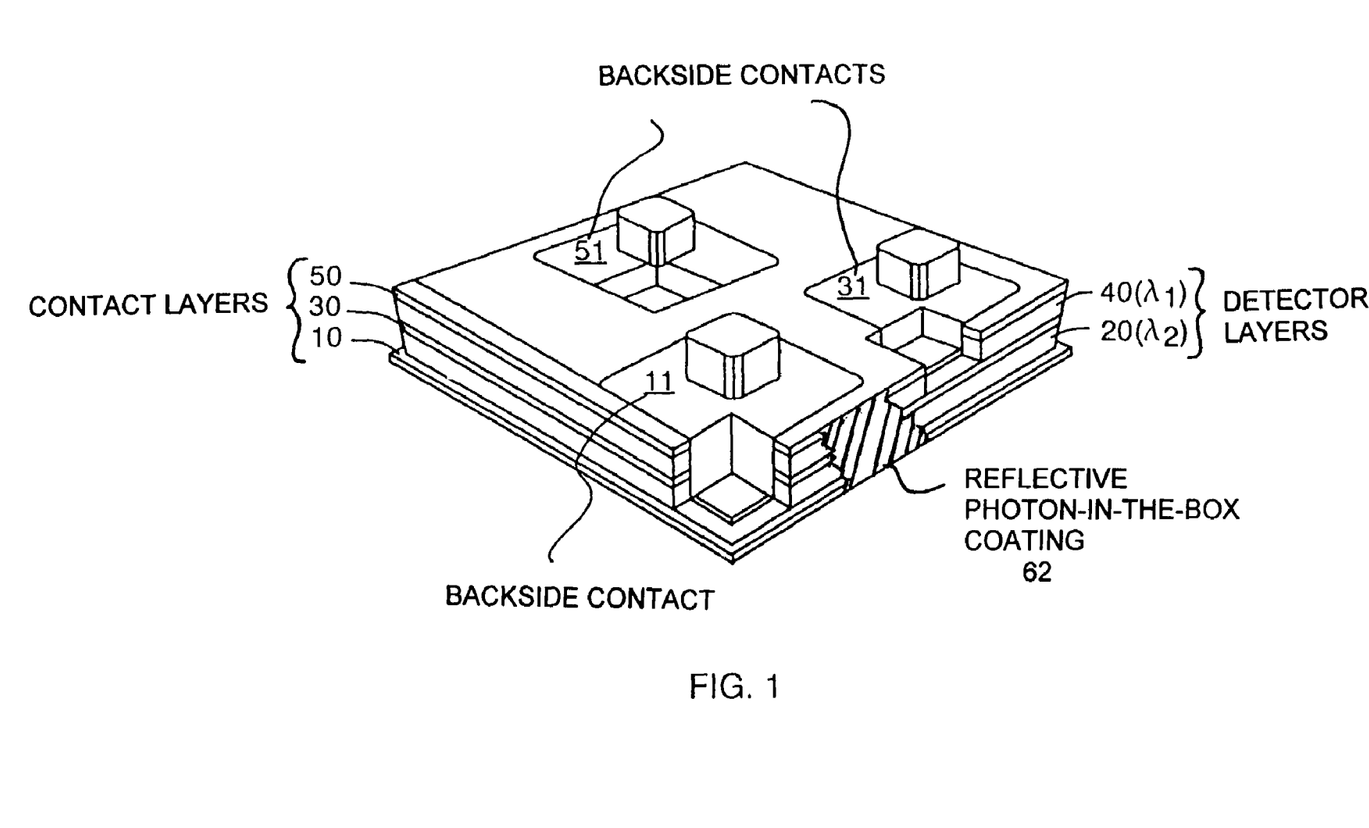
FIG. 1 is a partially cut-away perspective view of a light detector device configured in accordance with one embodiment of the present invention.

FIG. 1 is a partially cut-away perspective view of a light detector device configured in accordance with one embodiment of the present invention. As can be seen, this example light detector device is configured with multiple layers of interband materials designed for detecting light at two different wavelengths, $\lambda_1$ and $\lambda_2$. In particular, the device includes two layers 20 and 40 of detector semiconductor material, each with a different light absorption spectrum. Layer 40 detects $\lambda_1$ and layer 20 detects $\lambda_2$. In addition, note the contact layers 10, 30 and 50 of semiconductor material, which are electrically coupled to the backside contacts 11, 31, and 51 respectively, by metalized conductor strips. The backside connections are provided for applying detector bias and individual detector current readouts.

It will be appreciated that although this embodiment is capable of simultaneously detecting multiple wavelengths of light on a pixel-registered basis, other embodiments may be configured to detect a single wavelength. Thus, the layers of the QWIP structure or "photo detector" may vary depending on the particular application. For example, a single wavelength detector might have only one detection layer and two contact layers (one well contact and one common contact).

The structure can be created by conventional epitaxial growth of the various layers of semiconductor material upon a semiconductor substrate followed by selective removal of material using various etch techniques (wet and dry) to create the plateau-shaped device. The specific semiconductor materials used depend on the specific wavelengths to be detected. Binary and ternary compounds such as GaAs and AlGaAs, and quaternary compounds such as GaInAsP, can be used for fabrication of the device layers.

The semiconductor material of the detector layers 20 and 40 may be interband materials, where the layers are deposited in order from top to bottom of the photo detector by their respective response curves for detecting from longer to shorter wavelengths of light. The interband materials may include elements from among Groups II, III, IV, V and VI from the periodic table (e.g., GaAs, AlGaAs, and GaInAsP). Alternatively, the semiconductor materials of layers 20 and 40 may be quantum-well inter-sub band materials, from among Groups II, III, IV, V and VI from the periodic table (e.g., GaAs/AlGaAs and AlGaAs/InGaAs). Multiple sets of detector layers can be stacked on top of each other to form the sensor area of the QWIP structure. The contact layers can each be implemented, for example, as n-GaAs, with contact points covered in gold or palladium.

It will be appreciated that the thickness of the detector layers depends on the number of wavelengths being detected, as well the required depth of exposure or distance through which the light entering normal to the plane of the detector. This depth is set so as to obtain an adequate sampling of the wavelength of interest and create a corresponding signal.

In a multiple wavelength configuration having multiple detector layers, an edge connector can be included for providing the detector bias voltage, given limitations in the ability to fabricate posts and vias in proportionally thicker devices. Alternatively, a backside bias connection can be provided in the same plane as the detector signal contacts where the detector layers and contact layers are relatively thin (e.g., about one micron thick). This permits the etching of vias and wells sufficiently deep to reach the contact layers but still sufficiently small in width and cross-section to allow room for several contacts within the pixel surface area. Metal steps or strips can be used to electrically couple the contact layers to their backside surface pads.

Figure 2:
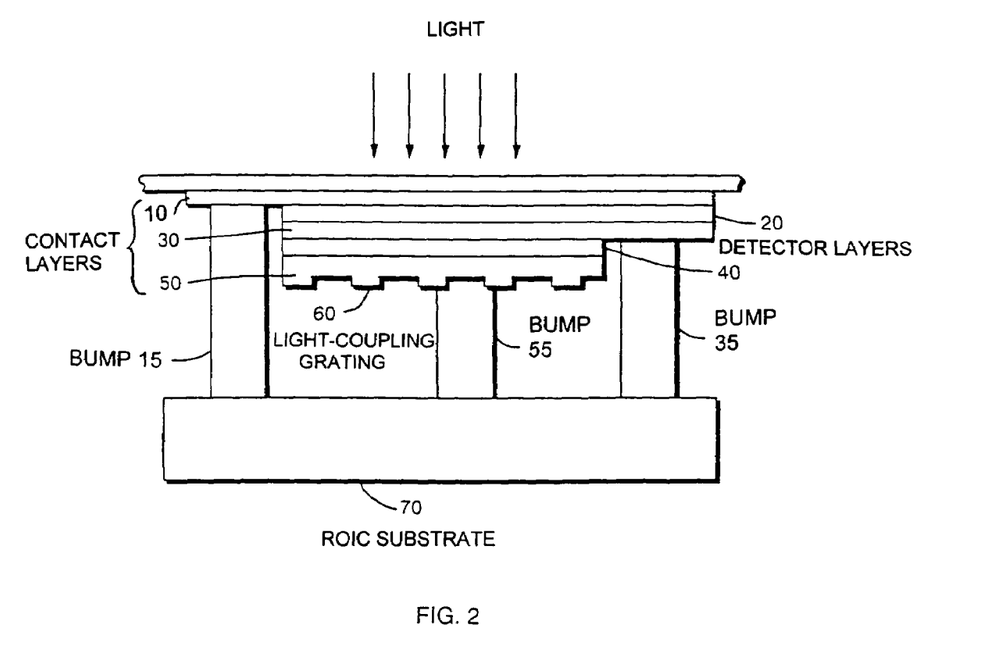
FIG. 2 is a cross-section view of the device shown in FIG. 1.

FIG. 2 is a cross-section view of the device shown in FIG. 1, and illustrates the contact layers 10, 30, and 50, and light detection layers 20 and 40. Also illustrated is a light-coupling grating 60 and interconnect bumps 11, 31, 51 used to electrically and mechanically couple the QWIP structure to a read out integrated circuit (ROIC) substrate 70. The three interconnect bumps 11, 31, 51 in this particular case couple the contacts for each of the detector layers 20 and 40, as well as the contact for the detector common. These bumps 11, 31, 51 can be implemented, for example, with In or an Indium-compound. Note that the QWIP structure is shown as inverted after hybridization process, where the QWIP structure is electrically and mechanically coupled with the ROIC substrate 70.

Figure 3:
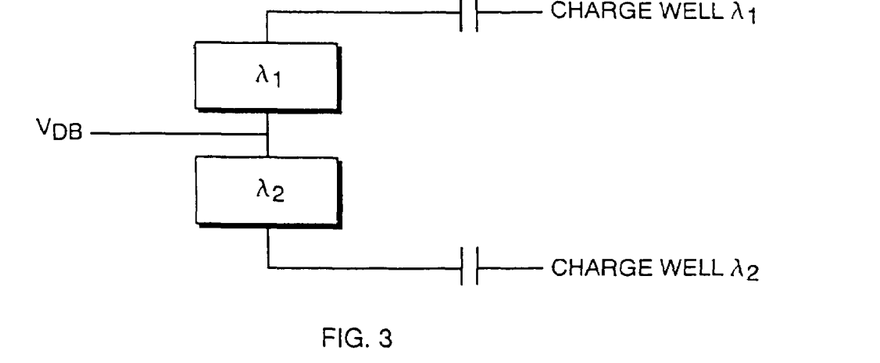
FIG. 3 is a simplified electrical schematic of the device shown in FIG. 1.

In operation, a detector bias voltage ($V_{DB}$) is applied to contact 31 with reference to contacts 11 and 51. For simplicity, note that the contacts corresponding to bumps 11, 31, and 51 are referred to herein as contacts 11, 31, and 51. Application of the detector bias voltage produces an electrical bias across each detector layer 20 and 40. The layer composition of the two photo detecting layers 20 and 40 is chosen so that when light of multiple wavelengths pass into the sensing area, the respective layers selectively absorb certain wavelengths of interest, while remaining transparent to other wavelengths. Absorption of the selected wavelength of light energy modulates current in the corresponding detector layer. This current is then measured separately and simultaneously by the ROIC present on substrate 70. The equivalent electrical schematic of FIG. 2 is depicted in FIG. 3.

The light-coupling grating 60 is etched or otherwise formed on the top of the final or backside contact layer 50. This grating 60 has a pattern that reflects a substantial portion of the light coming straight into the detector in a direction normal to the path of entry, dispersing it through detector layers 20 and 40 so as to maximize the exposure of the detector layer's semiconductor materials to the light. A photon box configuration can also be provided as explained herein to further reflect light that is dispersed substantially parallel to the focal plane, thereby preventing that dispersed light from escaping out the sides of the detector area.

The geometry and orientation of the pattern of grating 60, including the size, height, and spacing of the steps or wells of the grating 60, is optimized for the center wavelength of interest. In one particular embodiment, the depth or relief of the etching is one quarter wavelength of the wavelength of interest, while the spacing or pitch of the lines of the pattern is a wavelength in each direction. Also, the orientation of the grating 60 is about 45 degrees, but can range from about 20 to 70 degrees. Some types of grating 60 are oriented at 0 degrees. Various configurations of grating 60 will be discussed in more detail with reference to FIGS. 6a-b, 7a-f, and 8a-d.

Numerous variations on the illustrated embodiments will be apparent in light of this disclosure. For example, a multi-wavelength detector device configured in accordance with the principles of the present invention can be made from combinations of elements from groups II, III, IV, V and VI of the periodic table. Precise physical and performance characteristics depend on the exact composition of the material. Various metal conductors (e.g., gold, palladium) are deposited onto the structure to form electrical connectivity between bumps 11, 31, and 51 on the back surface of the device, and the respective contact layers 10, 30, and 50. Densely packed QWIP FPAs can be created on the same semiconductor substrate, and then be flip-chip mounted onto substrate 70 containing readout circuitry that is connected to the photo detectors through the metal contacts 11, 31 and 51.

FIG. 3 is a simplified electrical schematic of the embodiment of FIG. 1, illustrating the device's ability to detect two wavelengths of light. In this particular example, the detector bias voltage $V_{DB}$ is applied to node or contact 31 with respect to nodes or contacts 11 and 51. Each detector layer, 20 and 40, absorbs the particular wavelength of light for which it was designed. This absorption modulates the current passing through the detector layer caused by the applied voltage bias. The total current through each detector is separately collected by the readout integrated circuit and measured. This measured current is proportional to the amount of light absorbed by the associated detector.

In one embodiment, the ROIC substrate 70 is configured to measure the current from one detector layer at a time, switching rapidly between detector layers $\lambda 1$ and $\lambda 2$ to perform each measurement. In an alternative embodiment, the ROIC substrate 70 is configured to measure currents from both detector layers $\lambda 1$ and $\lambda 2$ simultaneously. Various multiplexing and signal processing schemes can be employed by ROIC substrate 70.

As previously stated, QWIP FPA structures configured in accordance with the principles of the present invention can be designed to detect one to many wavelengths simultaneously. For example, the two layer embodiment shown in FIGS. 1 and 2 can be extended by adding detection layers and backside contacts to accommodate four or more discrete detector layers within each pixel.

Absorption Spectra

Figure 4:
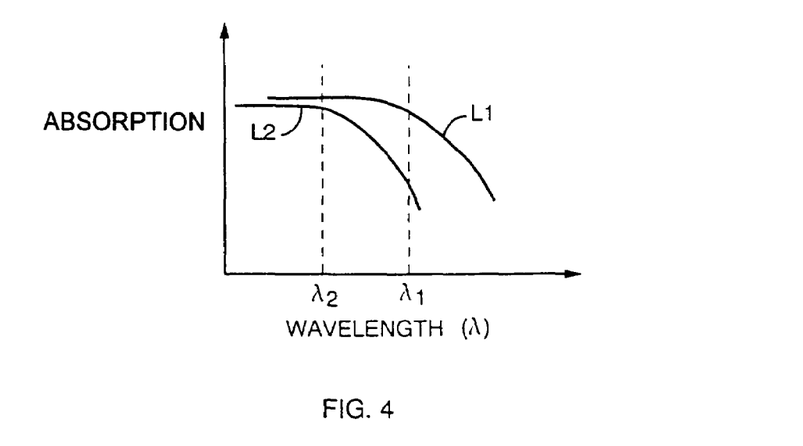
FIG. 4 is a graph illustrating the relationship between absorption and increasing wavelength for interband materials.

There are two general types of absorption spectra seen in the materials that can be used to produce the photo detectors configured in accordance with the principles of the present invention. First, there are interband materials, such as GaAs, InSb, and HgCdTe, which are typically designed for the detection of near, mid-wave and long-wave infrared radiation, respectively. The relative absorption spectra for these materials appear as shown in FIG. 4. The two curves L2 and L1 represent the absorption coefficients as a function of wavelength ($\lambda$) of the materials contained in detector layers 20 and 40 shown in FIG. 1. In general, each curve shows a region of high absorption at shorter wavelengths $\lambda_2$, while at longer wavelengths $\lambda_1$, the absorption diminishes.

To build a multicolor detector out of this type of material requires that the absorption spectra center around the wavelengths of light for which detection is desired, here assumed to be $\lambda_1$ and $\lambda_2$. This selection ensures efficient absorption of light at the selected wavelengths. In this example, detector layer 20 of FIG. 1 would be used to detect $\lambda_2$, and detector layer 40 would be used to detect $\lambda_1$. In addition, note that the materials are layered in the detector in an order such that light passes through detector layer 20 first and then through detector layer 40. The reason for this is that since the absorption spectrum for the material of layer 40 contains a region of high absorption that includes $\lambda_2$, it would incorrectly filter $\lambda_2$ along with $\lambda_1$ if it were placed first in the path of incoming light.

Figure 5:
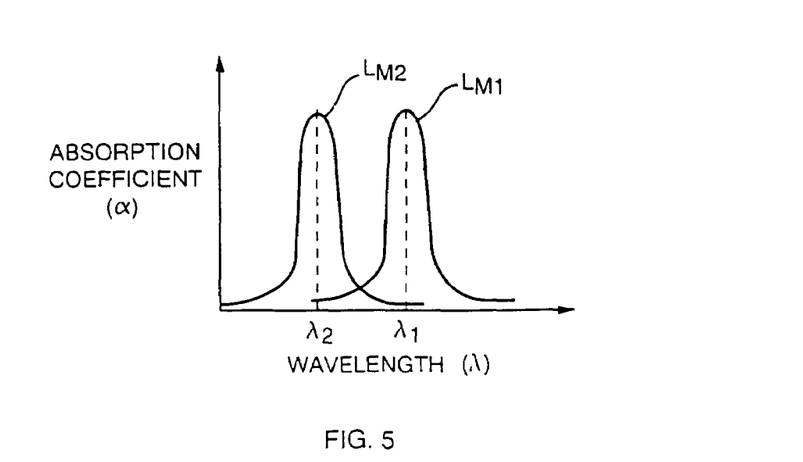
FIG. 5 is a graph of the absorption coefficient versus wavelength for the detection layers of the device shown in FIG. 1.

The second type of absorption spectrum is one seen in quantum-well inter-sub band materials, such as GaAs/AlGaAs, AlGaAs/InGaAs, designed to detect mid- and far-infrared wavelengths. FIG. 5 shows schematic representations of the absorption curves $L_{M2}$ and $L_{M1}$ for any two different quantum-well, inter-sub band materials M2 and M1. Note that these spectra do not overlap each other in their respective $\lambda_2$ and $\lambda_1$ regions of high absorption. When two such materials are used to create a multicolor photo detector configured in accordance with an embodiment of the present invention, then it is not necessary to form the structure with the layer sequencing constraint necessary with interband absorption materials.

Numerous potential applications for a detector configured in accordance with the principles of the present invention will be apparent in light of this disclosure. For example, with an array of dual-wavelength, photo detectors, a network interconnect can be created whereby one wavelength transmits the data value while the other wavelength transmits the inverted data value. In this way, a differential optical signal can be transmitted, improving noise margin and extending the physical range of optical interconnects. Another application for the invention described herein is in vision systems where pixel-registered images in multiple wavelengths are useful, including weapons targeting, chemical analysis, medical imaging and diagnostics.

Vertically stacking relatively thin (e.g., one micron or less) detector layers in order of transparency, and using the light-coupling grating 60 and associated "photon box" techniques, allows each detector the maximum exposure area to the incoming light. This improves detector performance as well as the detector fill factor, which is the active optical detector area divided by the total area. Also, with data from a given pixel collected at the same time for each color of that pixel, combined with discrete pixel bias control, complex data processing at each pixel site is enabled, thereby advancing the integration of sensing and processing power. Bringing the bias contact as well as the readout contacts to the backside surface of the pixel for mating to the ROIC substrate as with flip-chip or other bonding techniques facilitates the manufacturing process.

As will be apparent in light of this disclosure, the present invention is capable of numerous embodiments, and its various details and features are capable of modifications. For example, a multi-wavelength, pixel-registered photo detector array with a multiplicity of detector layers of semiconductor material interspersed between contact layers of semiconductor material, where each detector layer has a different light absorption versus wavelength response curve, and each detector layer is not more than about one micron in thickness, is enabled. Each pixel of the detector array may have a transparent face and a back side, where the back sides are all in a common plane to accommodate connection to a planar ROIC substrate using bump-bonding. In addition, each contact layer of each pixel may have a discrete electrical contact on the backside of the pixel, so that all the contacts are connectable to mating contacts on the planar substrate ROIC and other supporting electrical circuitry.

In such an embodiment, one contact layer of each pixel can be the final or capping contact layer that forms the back side. Alternatively, one contact layer of each pixel is proximate to the backside of the pixel due to having been coated (completely or partially) to insulate, reflect, or provide bumps or contacts and conductive leads to lower level contact layers. The outer surface of the final or capping contact layer may be etched in relief with a light-coupling grating pattern for reflecting light entering the pixel normal to the transparent face, so that the light will be substantially dispersed into the detector layers.

Light-Coupling Grating

The light-coupling grating pattern 60 may be configured in a number of ways. For example, the light-coupling grating 60 can be a grid of posts or wells, wherein the pitch of the post/wells is one wavelength of the center frequency of interest, and the area of the grid lines is about equal to the area of the square posts/wells. The pattern 60 may be oriented diagonally with respect to the major edges of the pixel so that the refracted light is directed towards the pixel edges at other than at right angles. The features of the pattern 60 may be etched, where the etch depth is about one quarter wavelength of the center frequency of interest. The top or final contact layer and the edges of the detector layers 20 and 40 of each pixel may be reflectively coated for containing light within the pixel, thereby causing that light to be reflected endlessly from edge to edge within the plane of the detector layers 20 and 40.

Figure 6A:
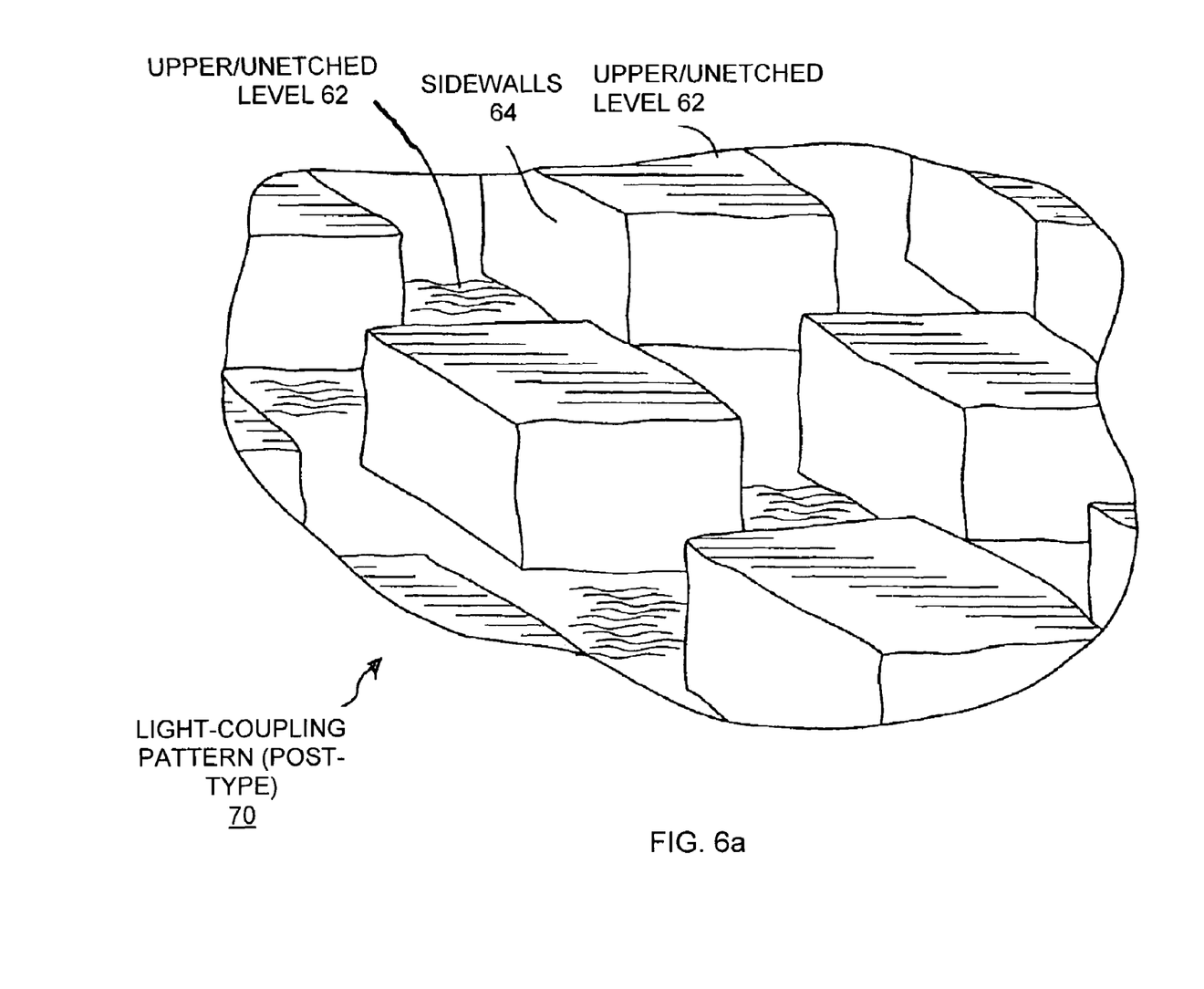
FIG. 6a is a partial perspective view of a post-type light-coupling grating pattern configured in accordance with one embodiment of the present invention.
Figure 6B:
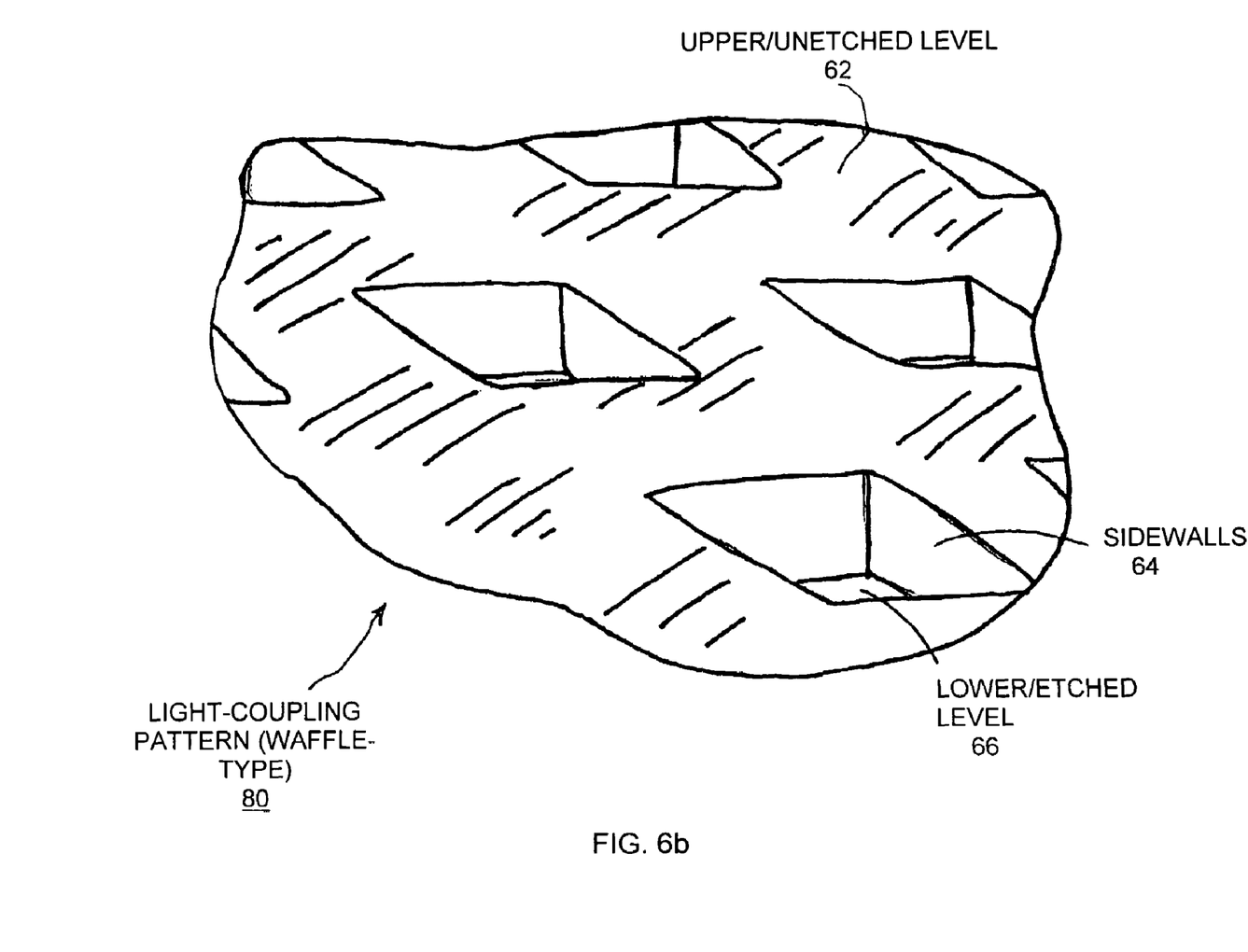
FIG. 6b is a partial perspective view of a waffle-type light-coupling grating pattern configured in accordance with another embodiment of the present invention.

FIGS. 6a and 6b each show a partial perspective view of a light-coupling grating pattern configured in accordance with an embodiment of the present invention. In one particular application, the top or unetched level 62 of light-coupling pattern 70 or 80 is first treated with an AuSnAu deposition or other suitable coating for electrical bonding of a contact pad. The full pattern 70 or 80 is then coated with a gold mask, assuring that sidewalls 64 and lower, etched levels 66 of the pattern are directly gold coated to achieve a smoother, more reflective quality with respect to the interior side of the coating. Note that the AuSnAu deposition is limited to the top surface 62 where bonding is necessary, because tin (Sn) tends to permeate the surface of the semiconductor material, leaving a rough texture to the coating interface on the contact layer that degrades the reflective properties of the coating. Further note that the bump or contact 51 for contact layer 50 (which is the top or final contact layer of the QWIP structure) is set on areas 62, the upper or unetched level of pattern 70 or 80.

The pixel edges of the detector layers 20 and 40 can also be gold coated to reflect the refracted light vectors repeatedly back into the detector layers 20 and 40 for maximum exposure of the detector layer material to the available light. The thin layers of the QWIP structure, light-coupling pattern 70 or 80, and associated reflective coatings create in effect what one might refer to as an open face "photon-in-a-box"

in which light enters the open face, is refracted at right angles off the backside of the box, and is hence reflected from side to side within the box.

As can be seen in FIG. 6a, a square post pattern 70 can be used. This post-like pattern 70 may be etched to remove grid lines 66, thereby leaving the upper/unetched level square posts 62 in relief. Alternatively, lower/etched level square wells 66 may be etched thereby leaving the grid lines 62 in relief, as shown in the waffle-like grating 80 of FIG. 6b. The resultant surface area of each post or well for a given pattern is about equal, as well each post height or well depth so as to provide a two dimensional grating. Note, however, that irregular grating patterns having varied post height or well depths can also provide benefits as will be apparent in light of this disclosure.

Figure 7A:
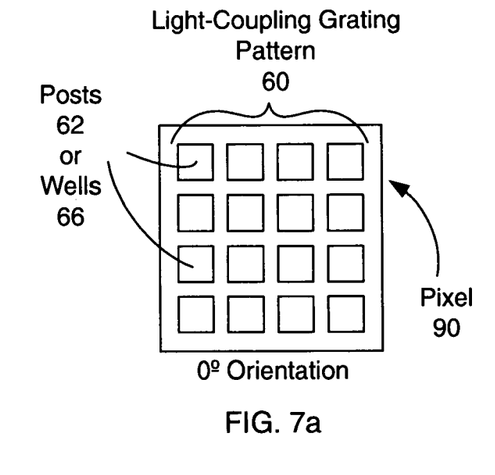
FIGS. 7a-f illustrate various orientations and patterns of light-coupling gratings configured to improve specific color absorption in accordance with embodiments of the present invention.
Figure 7B:
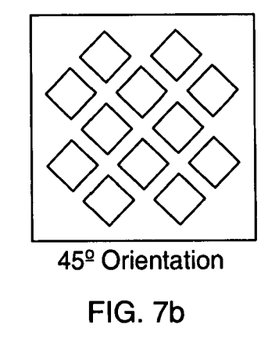

The refraction effect of a square pattern on light entering the detector tends to be bi-directional, oriented with the lines of the pattern. As such, the pattern can be diagonally oriented with respect to the edges of the pixel 90 as shown in FIG. 7a, so planar light vectors are initiated at angles other than perpendicular to the edges of the pixel 90. This further enhances edge reflection properties within the detector layer, bouncing the light vectors around the photon box rather than straight back and forth between opposing sides.

FIGS. 7a-f illustrate various orientations and patterns of light-coupling gratings configured to improve specific color absorption in accordance with embodiments of the present invention. Each pattern can be used in a post-type 70 or a waffle-type grating 80. However, as shown in FIGS. 8a-d, the quantum efficiency performance of optimized waffle-type gratings 80 exceeds that of the conventional post-type gratings 70. Grating parameter variables include, for example, pitch or spacing between etched and relief portions, duty cycle, polarity (e.g., post/waffle), orientation (e.g., 20° to 70°), depth (e.g., 5 depths, 0 to 1 μm), and metallization (e.g., photon-in-a-box with gold).

Figure 7C:
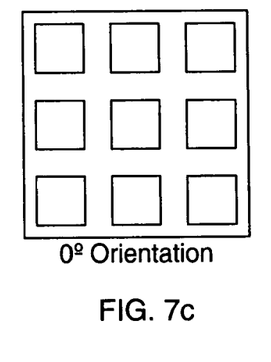
Figure 7D:
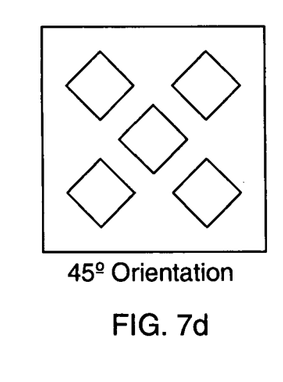
Figure 7E:
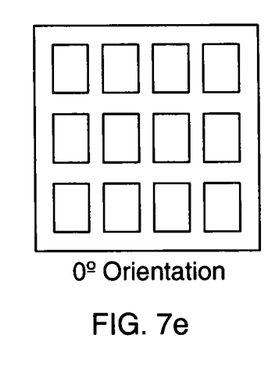
Figure 7F:
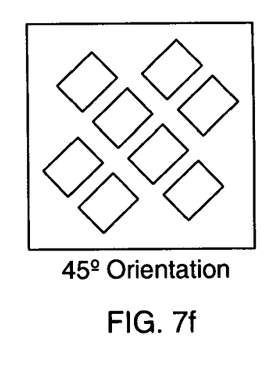

The patterns can be configured for a particular optical coupling application (e.g., one color detector in a 7×7 array having 50×50 or 100×100 μm pixels), and can be fabricated using wafer-level processing. FIG. 7a might be, for example, a blue square grating pattern oriented at 0°, while FIG. 7b can be a blue square grating pattern oriented at 45°. FIG. 7c might be, for example, a red square grating pattern oriented at 0°, while FIG. 7d can be a red square grating pattern oriented at 45°. FIG. 7e might be, for example, a red-blue rectangle grating pattern oriented at 0°, while FIG. 7f can be a red-blue rectangle grating pattern oriented at 45°.

Figure 8A:
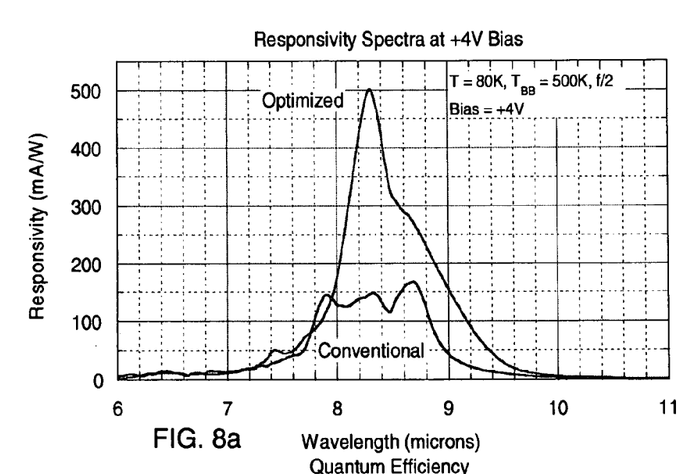
FIGS. 8a-d are graphs comparing quantum efficiency performance of post-type and waffle-type light-coupling gratings.
Figure 8B:
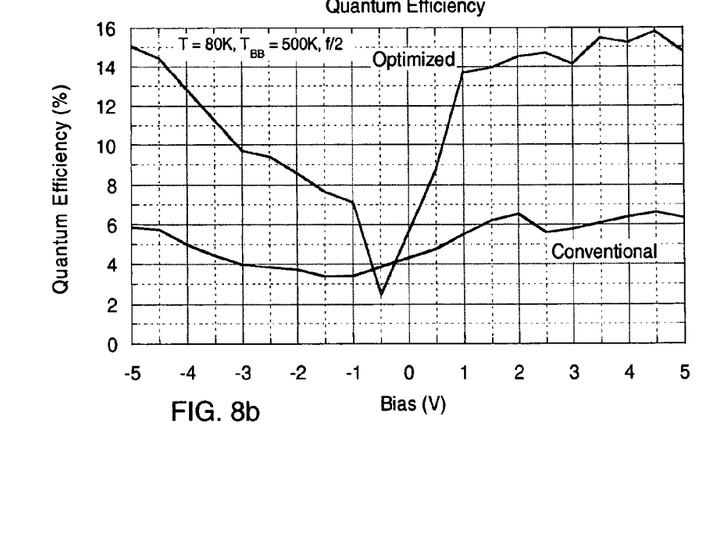
Figure 8C:
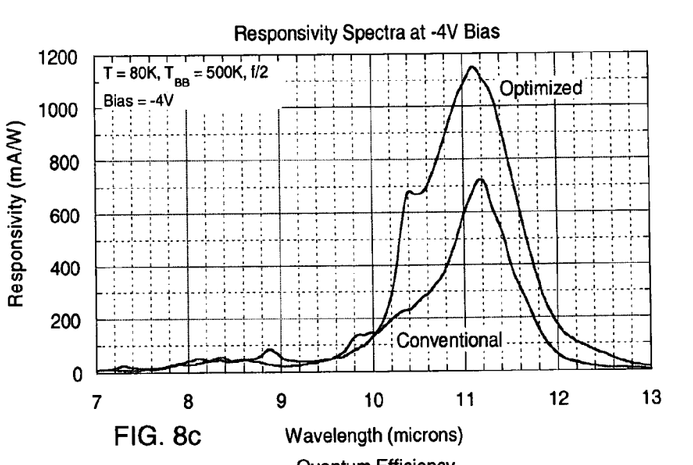
Figure 8D:
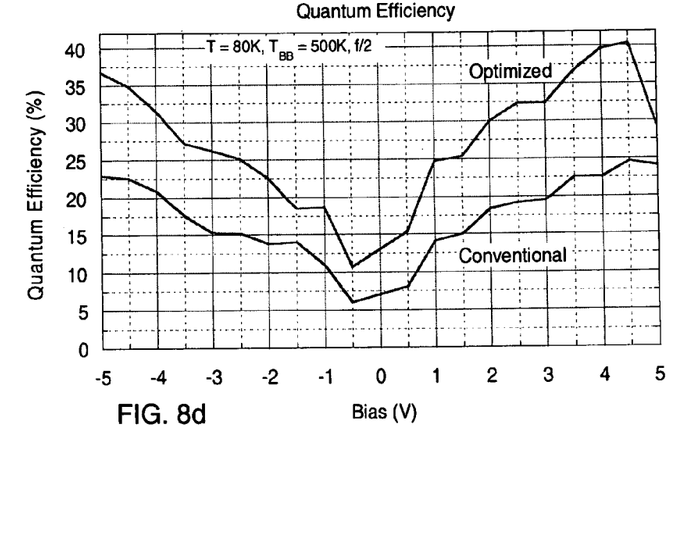

FIG. 8a compares the responsivity spectra of a 8.3 μm QWIP FPA at a +4 volts bias between a conventional post-type light-coupling pattern 70 (i.e., square post oriented at 0°) and a waffle-type light-coupling pattern 80 oriented at 45°. FIG. 8b demonstrates the improvement in quantum efficiency provided by the waffle-type grating 80 embodiment. Similarly, FIG. 8c compares the responsivity spectra of a 11.2 μm QWIP FPA at a −4 volts bias between a conventional post-type light-coupling pattern 70 (i.e., square post oriented at 0°) and a waffle-type light-coupling pattern 80 oriented at 45°. FIG. 8d demonstrates the improvement in quantum efficiency provided by the waffle-type grating 80 embodiment.

As can be seen, a waffle grating 80 oriented at approximately 45° provides a significant performance improvement. In particular, the quantum efficiency for the 8.3 μm QWIP FPA is as high as about 16%, and about 40% for the 11.2 μm QWIP. In addition, the conversion efficiency for the 8.3 μm QWIP FPA is as high as about 8%, and about 20% for the 11.2 μm QWIP. Thus, a waffle grating 80 etched into each QWIP pixel improves light absorption by quantum wells, relative to a post grating 70. Rotating the waffle grating 80 (e.g., 20° to 70°) further improves optical coupling by minimizing lateral light leakage out of the pixel 90. Note, however, that an unrotated waffle-type grating 80 (oriented at 0°) is also a viable embodiment of the present invention. Further note that a rotated post-type grating 70 (e.g., oriented between about 20° to 70°) is also a viable embodiment of the present invention.

Photon-in-a-Box Coupling

Figure 9:
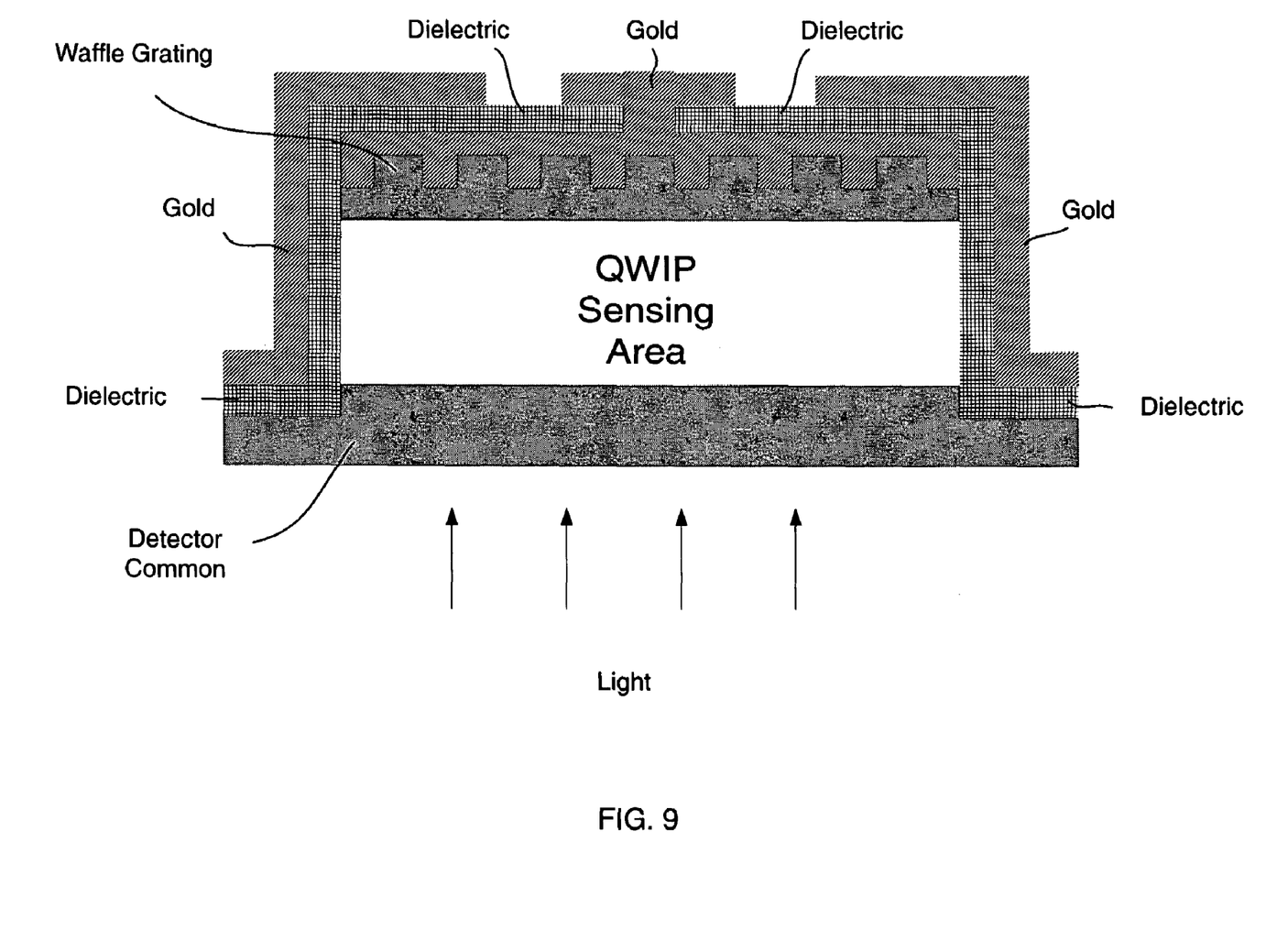
FIG. 9 is a cross-section view of a light detector device configured with photon-in-a-box coupling in accordance with one embodiment of the present invention.

FIG. 9 is a cross-section view of a light detector device configured with photon-in-a-box coupling in accordance with one embodiment of the present invention. As previously stated, the pixel edges of the QWIP sensing area (e.g., detector layers 20 and 40) can also be gold coated to reflect the refracted light vectors repeatedly back into the detector layers 20 and 40 for maximum exposure of the detector layer material to the available light. The pixel side wall coatings, in conjunction with the grating pattern, operate to effectively provide a "photon-in-a-box" in which light enters the box, is refracted at right angles off the backside of the box, and is hence reflected from side to side within the box.

In this particular example, a waffle grating is used and the pixel is coated with a dielectric layer and a gold layer (or other suitably reflective metal). With such a configuration, each IR photon undergoes multiple reflections, thereby increasing the probability of absorption into the quantum wells of the QWIP sensing area. Thus, quantum efficiency of the detector is increased (relative to non-waffle type gratings with no photon box). Note that the dielectric is transparent to the received light, but also prevents the gold layer from shorting to other conductors.

Hybrid Metal Optical Coupling

Figure 10:
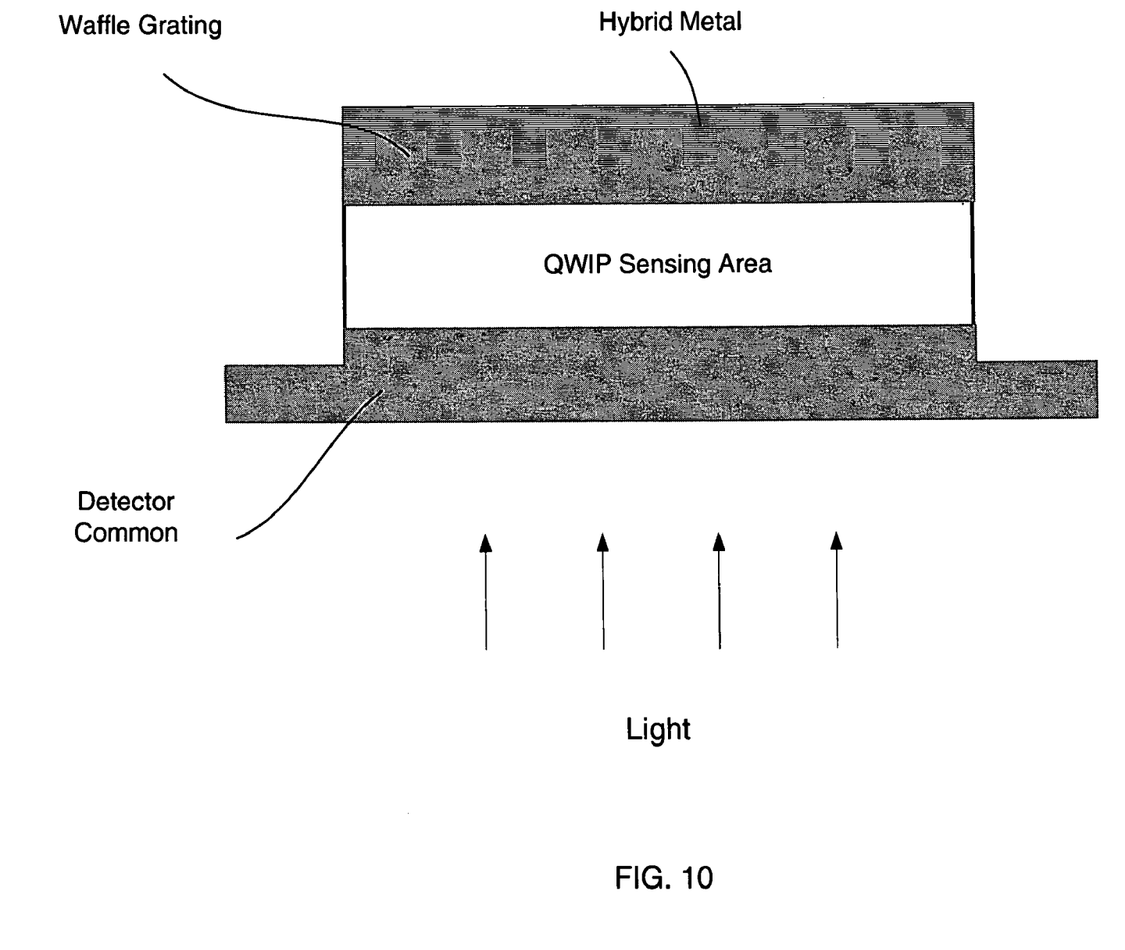
FIG. 10 is a cross-section view of a light detector device configured with a hybrid metal layer having both ohmic and reflective qualities in accordance with one embodiment of the present invention.

FIG. 10 is a cross-section view of a light detector device configured with a hybrid metal layer having both ohmic and reflective qualities in accordance with one embodiment of the present invention. Using a hybrid metal for the light-coupling grating metal operates to increase the reflectivity of the grating. The increased reflectivity operates to further reduce scattering and absorption loss. Thus, the light absorption by the quantum wells of the QWIP sensing area is beneficially increased, to provide greater detector efficiency.

In one embodiment, the hybrid metal covering the optical coupling grating is AuSnAu. Alternatively, the hybrid metal can be AuGeNiAu. Various metals (e.g., gold, tin, nickel, silver, and aluminum) can be used here to form a hybrid metal in accordance with the principles of the present invention. Using a hybrid metal as opposed to a conventional ohmic metal increases the conversion efficiency of the detector by a factor of about 1.75 for each color the detector senses.

Avalanche QWIP

Typical QWIP structures have about 20 to 40 quantum wells for absorbing IR photons. However, reducing the number of quantum wells allows the avalanche effect to be exploited. In particular, photocarrier avalanching can be used to make the photoconductive gain greater than 1, thereby improving the detector's external quantum efficiency.

Figure 11A:
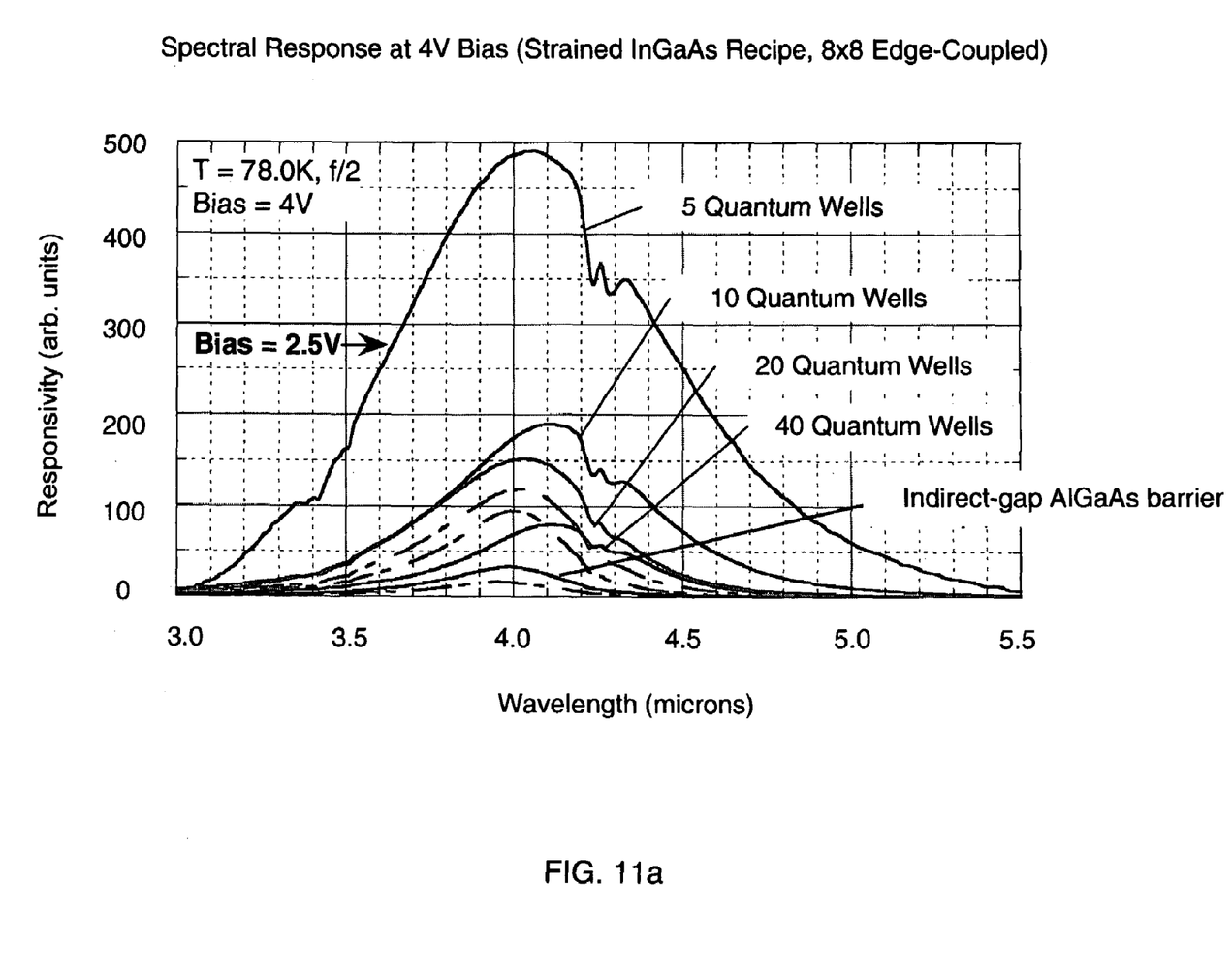
FIG. 11a illustrates the spectral response for an avalanche QWIP design configured in accordance with an embodiment of the present invention.

FIG. 11a illustrates the spectral response for an avalanche QWIP design configured in accordance with an embodiment of the present invention. In this particular example, a bias of 4 volts is applied to four strained InGaAs QWIP structures, each having a number (5, 10, 20, and 40) of quantum wells. As can be seen, the QWIP responsivity increases substantially as the number of quantum wells decreases. Also shown in FIG. 11a is the response of a conventional indirect-gap AlGaAs barrier QWIP design. Note that the peak responsivity of an Avalanche QWIP configured with 5 quantum wells and a bias of 2.5 volts is over ten times greater than a conventional an indirect-gap AlGaAs QWIP structure biased at 4 volts. Thus, an avalanche QWIP configured in accordance with the principles of the present invention provides increased responsivity at a lower power consumption.

Figure 11B:
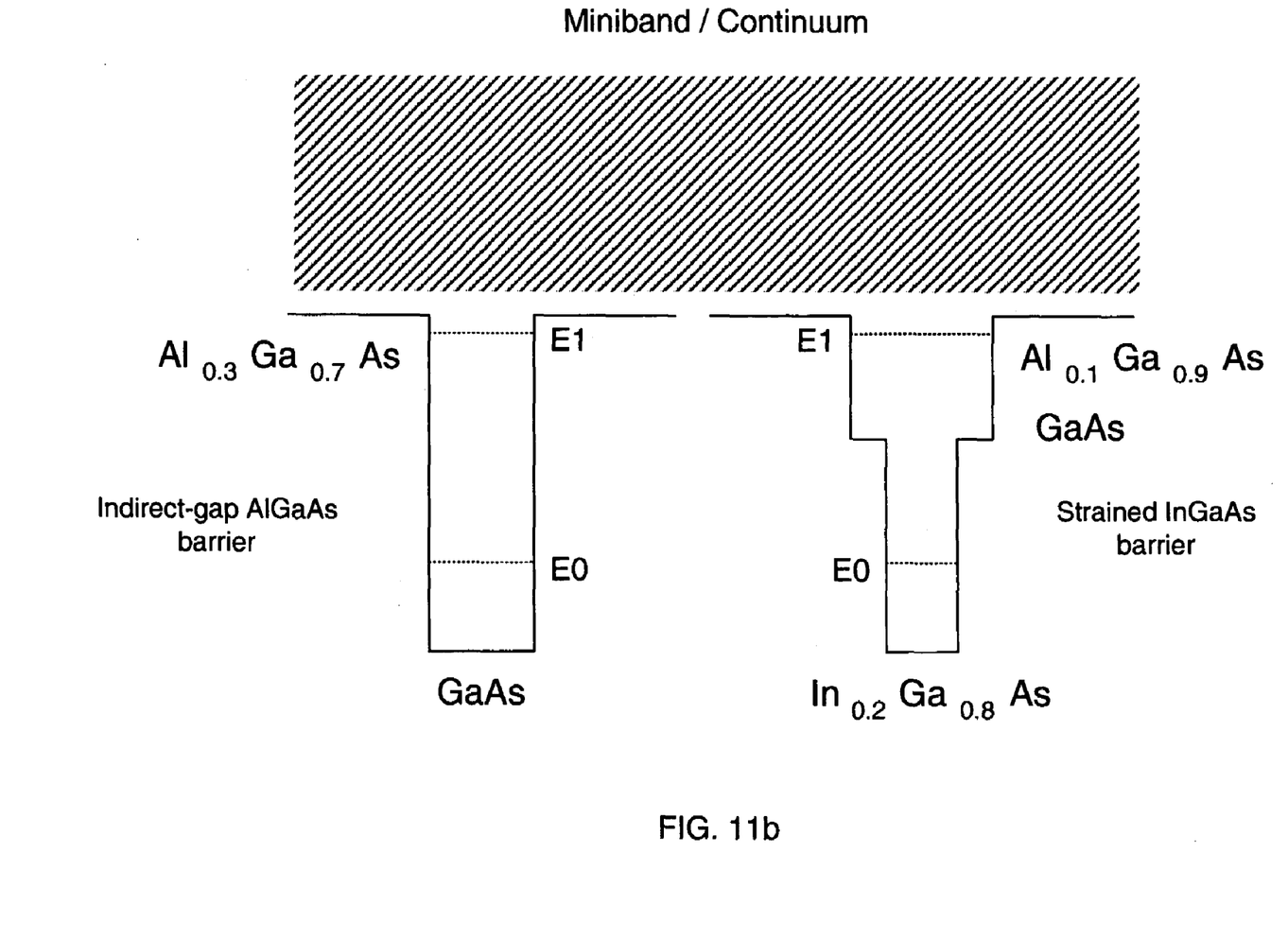
FIG. 11b illustrates both a conventional indirect-gap AlGaAs QWIP structure and a strained InGaAs QWIP structure configured in accordance with an embodiment of the present invention.

FIG. 11b illustrates both a conventional indirect-gap AlGaAs QWIP structure and a strained InGaAs QWIP structure configured in accordance with an embodiment of the present invention. Testing has shown that the InGaAs/InAlAs/InP QWIP is two times (or more) better than the conventional GaAs/AlGaAs structure with respect to both improved absorption (quantum efficiency) and higher speed (more gain). In addition, the strained-InGaAs/AlGaAs QWIP having the same quantum well depth as the conventional structure provides faster electron transport in low Al % AlGaAs barrier. Higher absorption is provided due to the lighter InGaAs well electron.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A photo detector array comprising:
   one or more detector layers of semiconductor material, each detector layer between contact layers of semiconductor material, thereby defining a stack of layers having a front side and a back side with at least one pixel formed therein; and a waffle-type light-coupling grating formed on the backside of the stack, the grating having a pattern of wells etched out from the backside, wherein the wells reflect a substantial portion of light coming into the array so as to disperse that light through the one or more detector layers, thereby facilitating absorption, wherein a surface area of said wells is about approximately equal to a remaining surface area of said backside, and a pitch of said wells is about one wavelength of a center wavelength of interest.

2. The array of claim 1 wherein the detector layers each have a different light absorption versus wavelength response curve thereby enabling a multicolor photo detector.

3. The array of claim 1 wherein edges of the one or more detector layers are reflectively coated so as to provide, in conjunction with the waffle-type light-coupling grating, a photon-in-a-box configuration for containing light within each pixel of the array.

4. The array of claim 1 wherein the waffle-type light-coupling grating includes a hybrid metal layer having both ohmic and reflective qualities.

5. The array of claim 1 wherein each of the one or more detector layers is about one micron or less in thickness.

6. The array of claim 1 wherein each of the contact layers is electrically coupled to a respective electrical contact on the backside, thereby facilitating hybridization when the array is connected to a substrate configured with supporting electrical circuitry.

7. A photo detector array comprising:
   one or more detector layers of semiconductor material, each detector layer between contact layers of semiconductor material, thereby defining a stack of layers of a multicolor photo detector having a front side and a back side and forming at least one pixel therein;
   a rotated waffle-type light-coupling grating formed on the backside of the stack and having a plurality of wells etched into an upper level, said wells having a plurality of well sidewalls and a lower level, and wherein the light-coupling grating having a pattern that reflects a substantial portion of light coming into the array so as to disperse that light through the one or more detector layers, thereby facilitating absorption, wherein a surface area of said wells is about approximately equal to a remaining surface area of said backside, and a pitch of said wells is about one wavelength of a center wavelength of interest.

8. The array of claim 7 wherein the light-coupling grating includes a hybrid metal layer having both ohmic and reflective qualities coating said grating, and edges of each of said detector layers are reflectively coated so as to provide, in conjunction with the light-coupling grating, a photon-in-a-box configuration for containing light within each pixel of the array.

* * * * *